(12) United States Patent
Djordjevic (10) Patent No.: US 7,861,029 B2
(45) Date of Patent: Dec. 28, 2010

(54) MEMORY MODULE HAVING BUFFER AND MEMORY RANKS ADDRESSABLE BY RESPECTIVE SELECTION SIGNAL

(75) Inventor: Srdjan Djordjevic, Munich (DE)

(73) Assignee: Qimonda AG, Munich (DE)

( * ) Notice: Subject to any disclaimer, the term of this patent is extended or adjusted under 35 U.S.C. 154(b) by 470 days.

(21) Appl. No.: 12/108,366

(22) Filed: Apr. 23, 2008

(65) Prior Publication Data

US 2008/0259670 A1 Oct. 23, 2008

(30) Foreign Application Priority Data

Apr. 23, 2007 (DE) .................. 10 2007 019 117

(51) Int. Cl.
*G06F 12/00* (2006.01)
(52) U.S. Cl. .................. 711/105; 711/154; 711/170; 711/211; 365/63
(58) Field of Classification Search .................. 711/105, 711/154, 170, 211; 365/63
See application file for complete search history.

(56) References Cited

U.S. PATENT DOCUMENTS

| | | | |
|---|---|---|---|
| 7,298,668 B2 | 11/2007 | Hoppe et al. | |
| 7,383,416 B2 * | 6/2008 | Oeschay et al. | 711/211 |
| 7,414,875 B2 * | 8/2008 | Lee et al. | 365/63 |
| 7,496,777 B2 * | 2/2009 | Kapil | 713/324 |
| 2006/0117152 A1 * | 6/2006 | Amidi et al. | 711/154 |
| 2007/0019494 A1 | 1/2007 | Moosrainer et al. | |

FOREIGN PATENT DOCUMENTS

| | | |
|---|---|---|
| DE | 10 2005 005 064 A1 | 8/2006 |
| DE | 10 2005 032 059 B3 | 1/2007 |

* cited by examiner

*Primary Examiner*—Stephen C Elmore (57) ABSTRACT

A memory module having a board and a plurality of memory elements on the board which belong to different memory ranks, each memory rank being addressable via a respective selection signal. The memory module additionally includes a memory buffer having a memory rank interface coupled to the memory elements of each memory rank, and a selection signal output for the selection signal of each memory rank, the memory elements being arranged in rows on the board and the memory elements of a memory rank extending only over half of the rows.

25 Claims, 11 Drawing Sheets

MEMORY MODULE HAVING BUFFER AND MEMORY RANKS ADDRESSABLE BY RESPECTIVE SELECTION SIGNAL

This application claims priority from German Patent Application No. 10 2007 019 117.2, which was filed on Apr. 23, 2007, and is incorporated herein by reference in its entirety.

TECHNICAL FIELD

The present invention relates to a memory module, like, for example, an FB-DIMM (fully buffered dual inline memory module), as are, for example, frequently used in computer systems.

BACKGROUND

With an increasing computing speed of modern computer systems, memory capacity requirements are increasing, too. Applications continuously increasing in complexity, like, for example, in the field of graphics, simulation or operating systems, necessitate continuously growing memory capacities and access speeds. Memory units, like, for example, FB-DIMMs, have been known in the field of conventional technology. FB-DIMM provide greater memory capacities for, for example, servers and work stations, high operating reliability and easy maintainability. FB-DIMMs exemplarily support DDR 2 (double data rate) SDRAM (synchronous dynamic random access memory) memory elements. An FB-DIMM, for example, includes a plurality of memory elements which can be addressed by an AMB (advanced memory buffer). An AMB can establish a connection to a so-called memory controller which is not located on the memory module, i.e., the FB-DIMM, via an input/output interface which may exemplarily include 24 differential line pairs.

An AMB can additionally communicate with memory elements which may also be implemented on the memory module. This may be realized via data and control lines, the complexity of the data and control lines growing with increasing memory requirements, i.e. increasing number of memory elements on the memory module. In the field of conventional technology, memory elements including several so-called dies have been known, for example. A die represents a memory region on a substrate, wherein several dies can be united to form a memory element, which may also be referred to as piggyback arrangements since individual dies may be arranged one above the other.

With increasing memory requirements and/or an increasing memory capacity, the number of data and/or control lines on a memory module also increases, wherein small distances between lines result in high line capacitances which in turn may affect the energy consumption of such a memory module in a negative way. Apart from the continuously increasing requirements for memory capacity, there is also demand for ever shorter access times to data stored. This means that the memory modules used are to be operated by ever higher clock rates so that propagation time effects on data and control lines are becoming important. With an increasing number of data and control lines and also increasing line capacitances, propagation time effects in memory modules may become critical and cause limiting effects.

SUMMARY OF THE INVENTION

According to embodiments, the present invention provides a memory module having a board and a plurality of memory elements on the board which belong to different memory ranks, each memory rank being addressable via a respective selection signal. Additionally, the memory module includes a memory buffer having a memory rank interface coupled to the memory elements of each memory rank, and a selection signal output for the selection signal of each memory rank, the memory elements being arranged in rows on the board and the memory elements of a memory rank extending only over half of the rows.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Referring to the subsequent description, it should be kept in mind that same functional elements or functional elements having the same effect have the same reference numerals in different figures in different embodiments and that the description of these functional elements in the different embodiments is mutually interchangeable so that a repeated description can be omitted. In addition, selection signals of a control bus will be looked at in the following description. Exemplarily, selection signals and selection lines for selecting memory elements and/or memory ranks which are also known as CS (Chip Select) signals and/or CS lines will be looked at. The aspects described herein after may similarly also be applied to other signals and lines, like, for example, clock enable (CKE) signals and lines or termination enable signals and lines (ODT=On Die Termination).

Memory modules may include several so-called dies which can be associated to the memory ranks of a memory module. Exemplarily, we differentiate between FB-DIMM modules having four and eight memory ranks which may include a high memory density and may comprise capacities of, for example, 8 or 16 gigabytes. Memory elements made up of 1-Gbit dies may exemplarily be used. These dies may be arranged one above the other in a piggyback manner and be addressed via the same data lines by different selection lines. One conceivable configuration would be an arrangement of 2×1-Gbit dies.

The memory elements can be arranged on the memory module in several rows, and on the front and back sides of a memory module board. The AMB is frequently arranged in the center of such memory modules, like, for example, FB-DIMMs, and supports configurations of, for example, four or eight memory ranks, wherein frequently the minimum number of control signals is used. In order to save chip surface area when implementing the AMBs, using independent control lines for the right and left sides of, for example, a DIMM may be dispensed with. Furthermore, implementing control lines for both sides of the AMB may complicate the design and increase the power consumption and number of terminals of the AMB. Consequently, AMBs which only comprise one selection signal for both sides of the DIMM are frequently used, which in turn may be differentiated by a two-row and a four-row FB-DIMM design. The result may be high loads on the control signal bus and a very complex topology of the selection signal lines on the memory module. High load on a selection line results in a high energy consumption at this position and degradation of the signal integrity, i.e. settling processes, propagation time effects etc. distort the selection signals.

Figure 1:
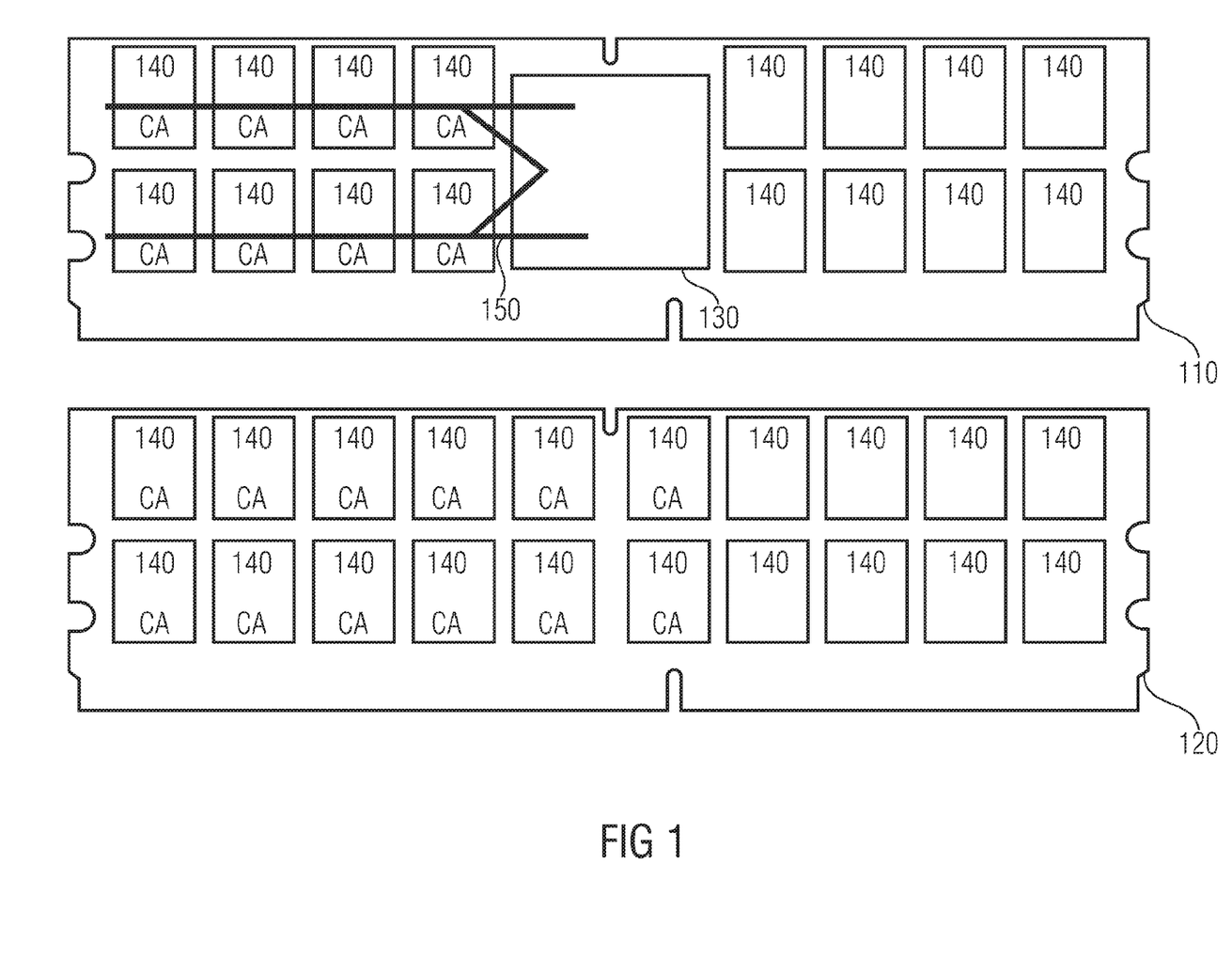
FIG. 1 shows a schematic illustration of a two-sided FB-DIMM.

FIG. 1 shows a schematic illustration of an FB-DIMM, wherein the front side 110 of the FB-DIMM is illustrated in the top region of FIG. 1 and the back side 120 in the bottom region. An AMB 130 and 16 memory elements 140 are illustrated on the front side 110 of the FB-DIMM. In addition, 20 further memory elements 140 can be seen on the back side of the FB-DIMM 120. A memory element 140 may consist of several dies, like, for example, two dies. The front side 110 of the FB-DIMM additionally shows, in schematic representation, an address line 150 which exemplarily feeds column addresses (CA) to the memory elements 140. The address line 150 is illustrated symbolically and may in reality include an entire group of lines the size of which may depend on the number and size of the dies and/or memory elements 140.

Figure 2:
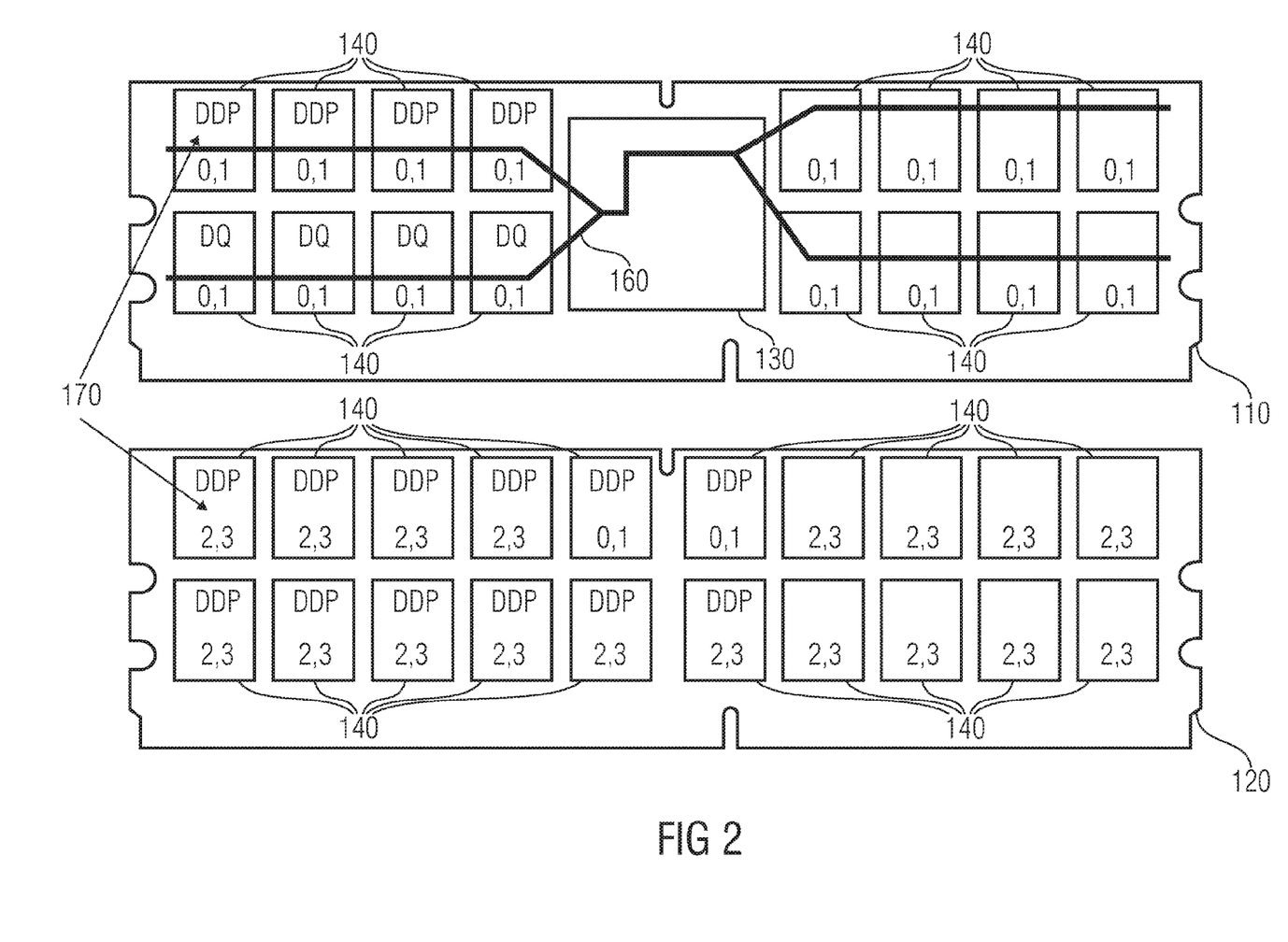
FIG. 2 shows a schematic illustration of a control line on a two-sided FB-DIMM.

FIG. 2 again shows a schematic illustration of the front side 110 and the back side 120 of an FB-DIMM. The FB-DIMM illustrated in FIG. 2 comprises the same components as the memory module illustrated in FIG. 1. In the illustration of FIG. 2, the memory elements 140 are implemented as dies which are made up of two memory blocks above each other (DDPs; DDP=dual die package). Two memory ranks are realized within a memory element 140 in FIG. 2, the memory ranks within the memory elements 140 in FIG. 2 being identified by "0, 1" for memory ranks 0 and 1 and "2, 3" for memory ranks 2 and 3. The individual memory ranks are selected via selection lines, a selection line 160 via which the memory rank 0, for example, may be selected being illustrated schematically in FIG. 2 on the front side 110 of the FB-DIMM. Additionally, it is to be noted that data lines which are not illustrated explicitly in FIGS. 1 and 2 for clarity reasons are routed from each memory element 140 to the AMB. In order to reduce the number of data lines, several memory elements may be connected in parallel to the data bus, wherein these may be selected via corresponding selection lines of the individual memory ranks, wherein only a single memory rank will be active at one time. In this context, the data lines are also referred to as DQ groups (data line groups), memory elements 140 and/or dies connected in parallel being associated to one DQ group. Such a DQ group 170 is also shown in FIG. 2.

As can be seen in FIG. 2, the selection line 160 comprises four branches which may be terminated independently at the ends thereof. The four terminations at the ends of the branches of the selection line 160 result in a higher power consumption and reflections, i.e. signal distortions of the selection signal. The topology of the selection line of the FB-DIMM in FIG. 2 is unfavorable. The same would apply for a clock enable signal by means of which the memory elements of a memory rank are addressed, since the load here also increases corresponding to the branches of the lines.

Figure 3:
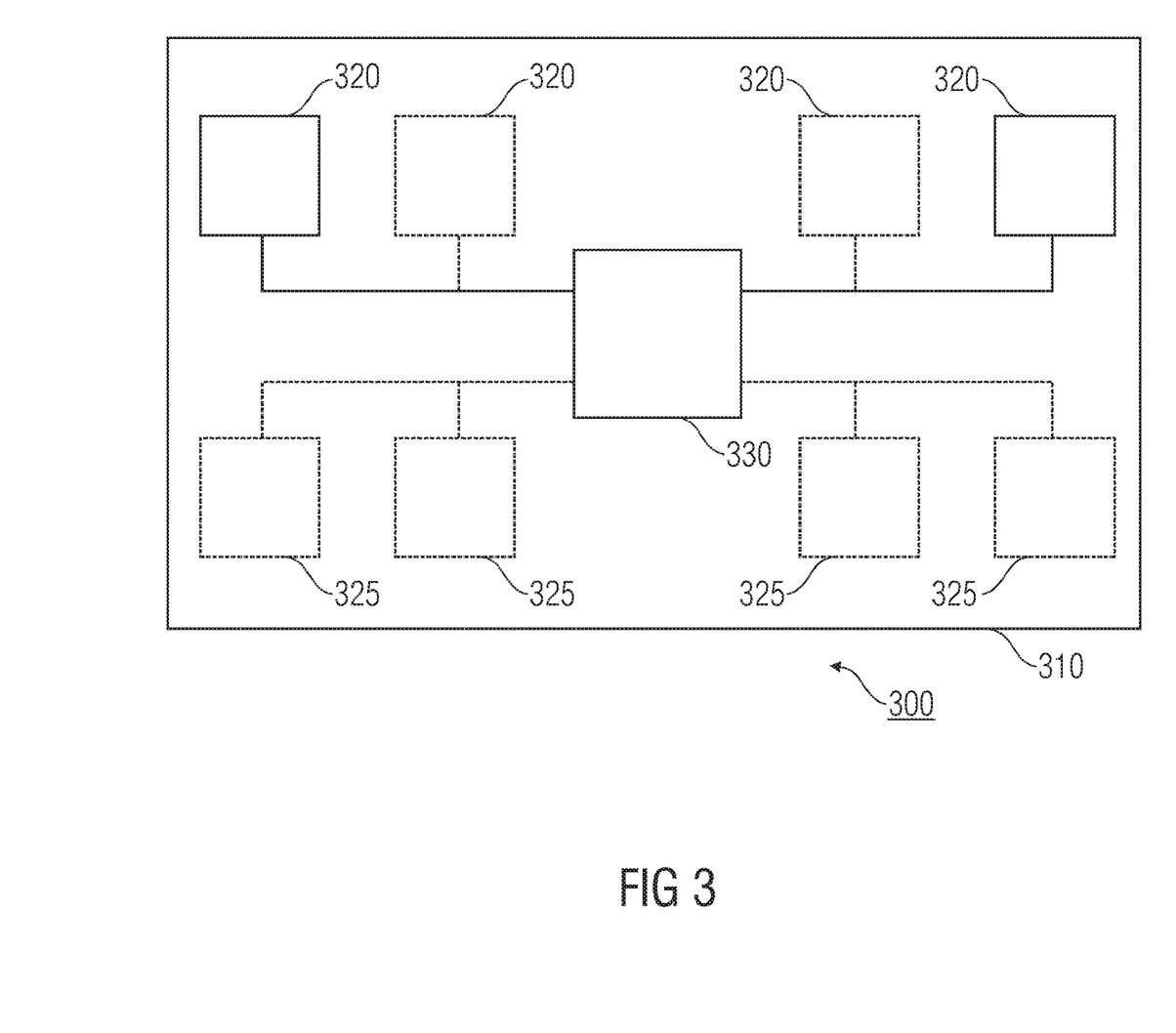
FIG. 3 shows an embodiment of a memory module.

Embodiments of the present invention provide memory modules, the DQ groups of which can be associated such that the number of branches of a selection line is reduced. FIG. 3 shows a schematic illustration of an embodiment of the present invention. FIG. 3 shows a memory module 300 comprising a board 310 and a plurality of memory elements 320 and 325 on the board 310 which belong to different memory ranks, each memory rank being addressable via a respective selection signal. In addition, the memory module 300 includes a memory buffer 330 comprising a memory rank interface which is coupled to the memory elements of each memory rank, and a selection signal output for the selection signal of each memory rank, the memory elements 320 and 325 being arranged in rows on the board 310 and the memory elements 320 or 325 of a memory rank extending only over half of the rows.

FIG. 3 shows a memory module 300 including at least two memory elements 320, the optional memory element 325 being illustrated in broken lines. The interface, both for data and for the selection signals between the memory buffer 330 and the individual memory elements 320 and 325 in FIG. 3 is illustrated as a line, symbolizing a corresponding line group, connecting the memory elements 320 and 325 to the memory buffer 330. Furthermore, the memory elements and 320 and 325 in FIG. 3 are, for example, arranged in two rows on the memory module board 310. According to the embodiment, the memory element 320 belong to a different memory rank than the memory elements 325. For this reason, a selection line can comprise only two branches which are sufficient to select the memory elements 320 or 325 of a row. The memory elements 320 and 325 may be arranged on the front and back sides of a memory module and may be through-contacted, i.e., the selection line can allow addressing memory elements 320 and 325 on the front side and the back side of the memory module 300.

Figure 4:
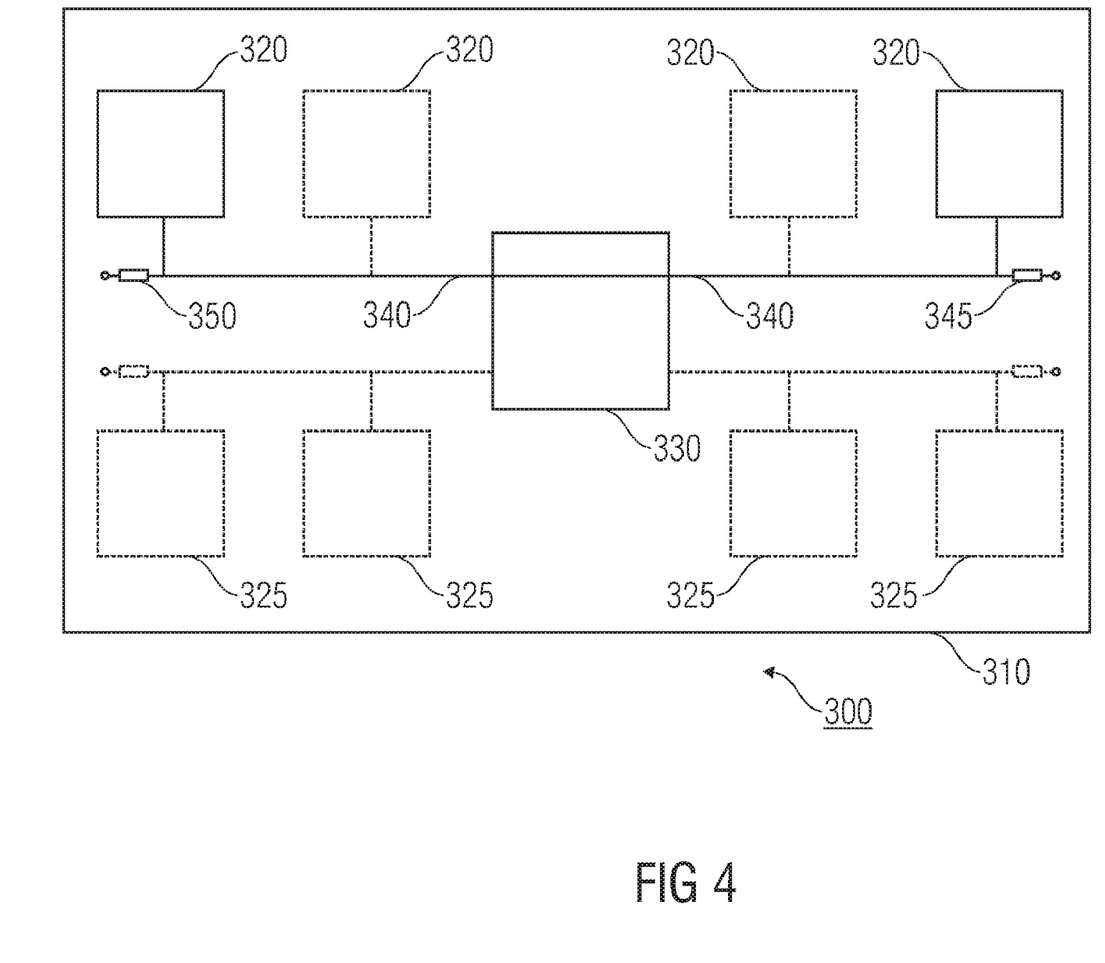
FIG. 4 shows another embodiment of a memory module.

FIG. 4 shows another embodiment of a memory module 300 comprising a board 310 and a plurality of memory elements 320 and 325 on the board 310 which belong to different memory ranks, each memory rank being addressable via a respective selection signal. The memory module 300 of FIG. 4 includes a memory buffer 330 (AMB) comprising a memory rank interface which is coupled to the memory elements 320 and 325 of each memory rank, and a selection signal output for the selection signal of each memory rank. The memory module 300 of FIG. 4 additionally includes one selection line 340 per memory rank which connects the respective selection signal output to the memory elements 320 of the respective memory rank so that the memory elements 320 of the memory rank are addressable via the selection line 340, the selection line 340 comprising only two branches which are each terminated only at a distal end, like, for example, by resistors 345 and 350.

FIG. 4 shows an embodiment of a memory module 300 in which memory elements 320 and 325 are arranged into rows. In principle, other arrangements are also conceivable, like, for example, 4, 8, 16, etc. rows. FIG. 4 shows the selection line 340 comprising only two branches which are terminated by resistors 345 and 350 at the ends thereof so that, compared to four lines, a correspondingly smaller amount of power is necessary to drive the selection line 340. Again, the memory elements 320 and 325 of a memory rank are arranged along a selection line. In the embodiment of the memory module 300 of FIG. 4, the memory elements identified by 320 belong to a memory rank and memory elements identified by 325 belong to another rank. Correspondingly, the memory elements 325 are driven via a different selection line which in FIG. 4 is indicated in broken lines.

Figure 5:
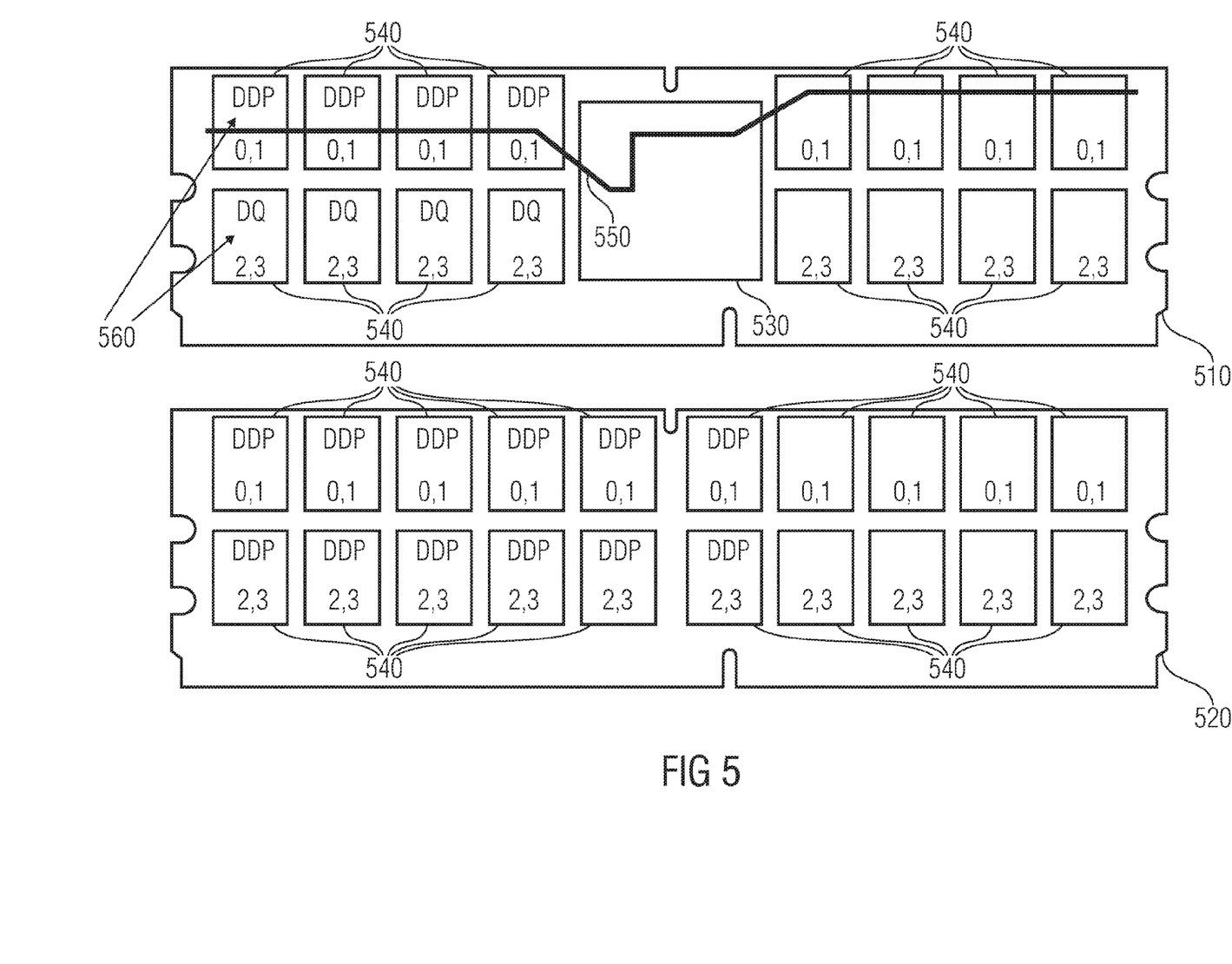
FIG. 5 shows a schematic illustration of an embodiment of a control line on a memory module.

Embodiments of the present invention may also be characterized by selection lines 340 passing along a board 310, the selection line 340 being routed along only one half of the memory elements 320 and 325. When comparing the embodiments of the memory modules 300 of FIGS. 3 and 4 to those of FIG. 2, it may be noted that DDPs opposite to each other are associated to the same memory rank so that these can be addressed only by the same selection line. FIG. 5 shows another embodiment of an FB-DIMM in schematic illustration, the front side 510 being illustrated in the top part of FIG. 5 and the back side 520 of the FB-DIMM being illustrated in the bottom part.

FIG. 5 shows a memory buffer (AMB) 530 in the center of the front side 510, a plurality of memory elements 540 which may be implemented as dual die packages, wherein a memory rank can be associated to a dual-die package, which in FIG. 5 is indicated by the identification of memory ranks 0, 1 and 2, 3 per dual-die package. According to an embodiment, FIG. 5 additionally shows a selection line 550 which allows the memory elements 540 of, for example, the memory rank 0 to be selected and which can do with only two branches. It is to be pointed out that the memory elements 540 of the top row on both the front side 510 and the back side 520 of the memory module can be addressed by means of the selection line 550. Due to the altered arrangement of the memory ranks in embodiments, the DQ groups change, too. FIG. 5 shows a DQ group 560, wherein it can be seen that memory elements of different rows here are associated to a DQ group, whereas in the conventional memory module illustrated in FIG. 2 opposite memory module, see DQ group 170, are associated to a DG group.

The signal integrity of the selection signal improves due to the smaller number of branches of selection lines since the line capacitance is reduced. In analogy, the power consumption of a memory module is reduced with a smaller number of terminations. The same also applies for clock enable signals, because only those memory elements belonging to one memory rank would correspondingly have to be clocked at the same time.

In embodiments, the memory elements 320 and/or 325 may include DDR-RAM memory. The memory elements 320 and 325 may be arranged on the front and back sides of the board 310. Exemplarily, a memory rank may include 18 memory elements or dies. Thus, four bits of data words may, for example, be storable per memory element 320 or 325. The memory buffer 330 may include an AMB chip which may be arranged in the center of one side of the board. The memory rank interface may, for example, include 72 data lines.

In further embodiments, the memory elements 320 or 325 may be arranged in two or even four rows on one side of the board. In other embodiments, they may be arranged on the front and back sides of the board. Embodiments may, for example, comprise 4, 8, 16 or more memory ranks. As has already been mentioned, it is also conceivable for a memory element 320 or 325 to include several dies which may be connected to one another mechanically in a piggyback arrangement and be arranged in rows on the board. Additionally, embodiments of the memory buffer 330 may be adapted to take delays into consideration for each memory element 320 or 325 and/or for groups of memory elements 320 or 325.

In other embodiments, the branches of the selection line 340 may be terminated by resistors 345 and 350. Termination may, for example, be to a reference potential VDD (drain voltage, supply voltage) or GND (ground).

In another embodiment, an FB-DIMM may include a memory module 300 according to one of the above embodiments. Such an FB-DIMM may, for example, be employed in a computer.

Another embodiment includes a board comprising a plurality of first connectivity options for a plurality of memory elements which may belong to different memory ranks, each memory rank being addressable via a respective selection signal. Furthermore, the board may comprise a second connectivity option for a memory buffer comprising a memory rank interface coupled to the connectivity options for the memory elements of each memory rank, and a third connectivity option for a selection signal output for the selection signal of each memory rank. In one embodiment, the connectivity options for the memory elements may be arranged in rows on the board and the connectivity options of the memory elements of one memory rank extend only over half of the rows.

In another embodiment, the board may comprise one selection line per memory rank coupling the respective connectivity option for the selection signal output to the connectivity options of the memory elements of the respective memory rank, so that the connectivity options of the memory elements of the memory rank are addressable via the connectivity options of the selection signal output, the selection line comprising only two branches which may each be terminated only at a distal end.

In another embodiment, the board may comprise a selection line which is routed along only one half of the connectivity options for the memory elements.

Figure 6:
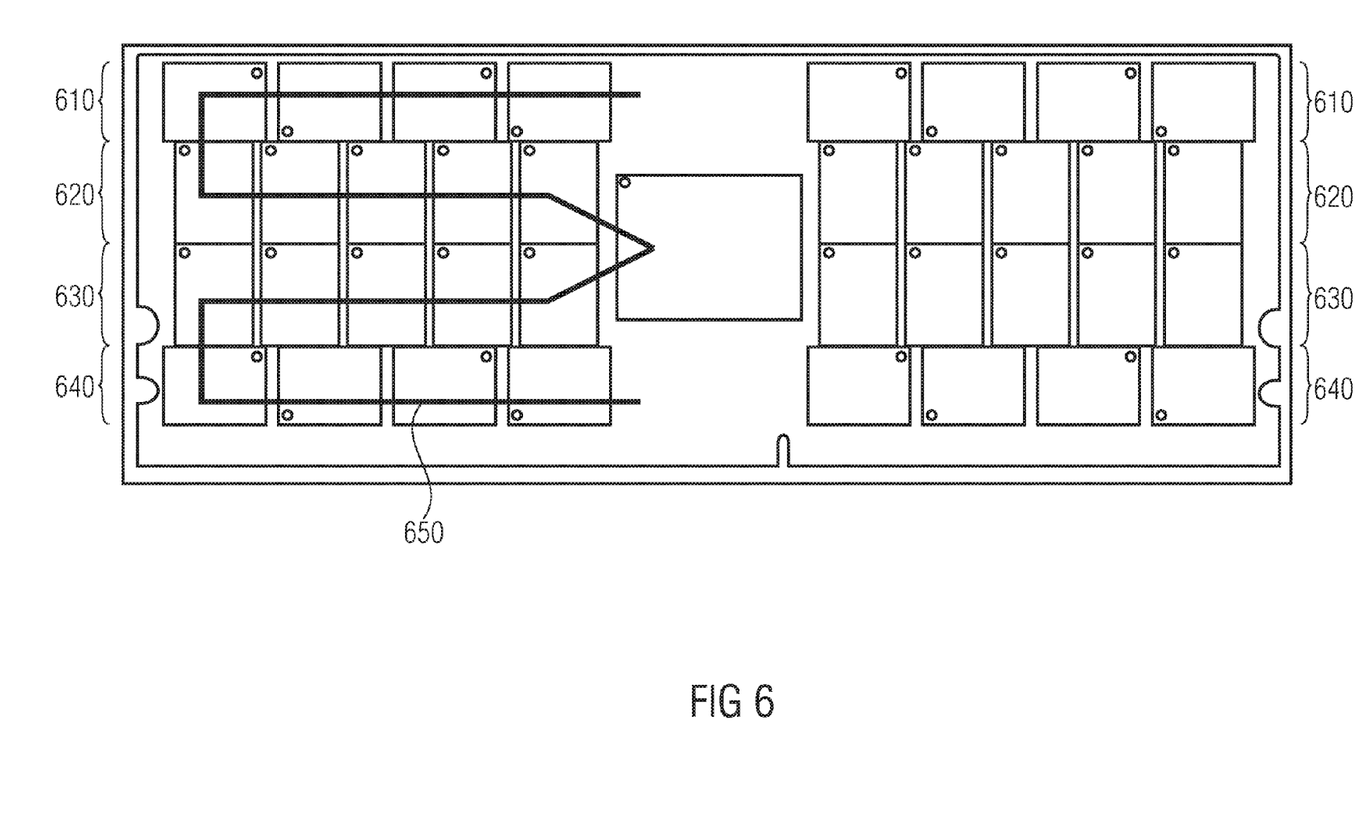
FIG. 6 shows a schematic illustration of a control line on a four-row FB-DIMM.

FIG. 6 shows a schematic illustration of an FB-DIMM having a memory element arrangement in four rows 610, 620, 630 and 640. Additionally, FIG. 6 shows a white selection line 650 illustrated only on the left side of the FB-DIMM and comprising two branches of which each addresses two rows of memory elements of one side of the FB-DIMM.

Figure 7:
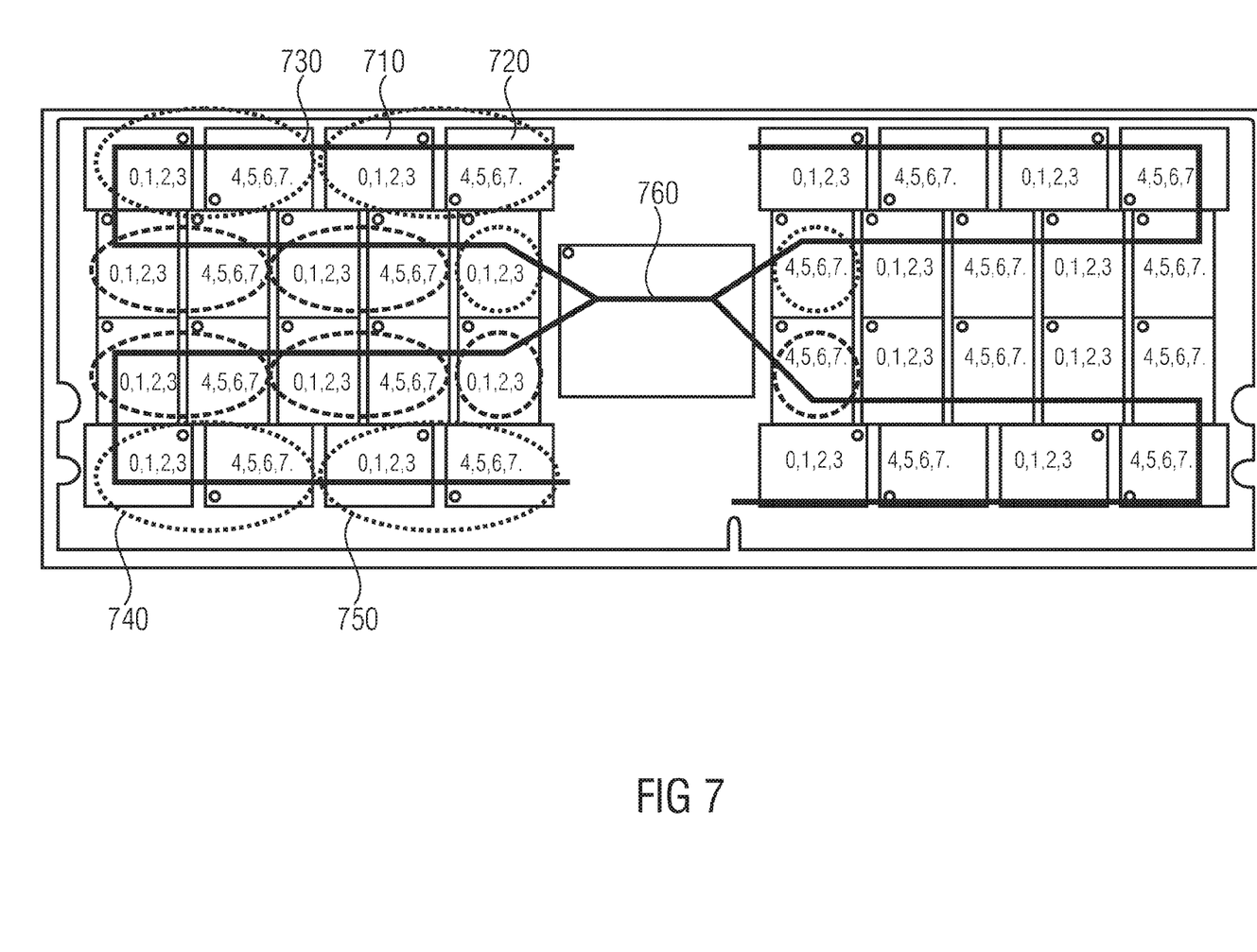
FIG. 7 shows a schematic illustration of memory ranks on a memory module.

Another FB-DIMM comprising an arrangement of memory elements in four rows, a total of eight memory ranks being present, is illustrated in FIG. 7. The memory elements illustrated in FIG. 7 of which memory elements 710 and 720 are identified on behalf of all the memory elements shown, additionally comprise a labeling of the memory ranks arranged therein. Exemplarily, memory ranks 0, 1, 2 and 3 are managed in the memory element 710, memory ranks 4, 5, 6 and 7 in the memory element 720. Several configurations of memory elements are conceivable here. Exemplarily, four dies may be disposed one above the other in a piggyback arrangement. Another configuration would be two dies each in a piggyback configuration on both the front and back sides of the memory module.

As can be seen from the association of memory ranks to memory elements in FIG. 7, four branches of the selection signal line are necessary for selecting a certain memory rank, which in turn may result in an increased power consumption and signal distortions of the selection signal. In addition, FIG. 7 shows DQ groups which are identified by ellipses and circles and of which the DQ groups 730, 740 and 750 are identified on behalf of the others. According to the above discussions, with the arrangement of the DG groups and the selection line topology illustrated in FIG. 7, it is necessary to route the selection line past all the memory elements irrespective of which memory rank is to be selected. This in turn results in the increased power consumption mentioned on several occasions and signal distortions.

Furthermore, it can be seen in FIG. 7 that the memory elements of a memory rank have different distances and thus signal propagation times to the memory buffer 760. Different signal propagation times to or also from the memory buffer to the memory elements can be compensated by memory buffers, like, for example, AMB. In the configuration illustrated in FIG. 7, it can be seen that, when a memory element provides four bits each, these delays may be adjusted on the basis of bytes.

Figure 8:
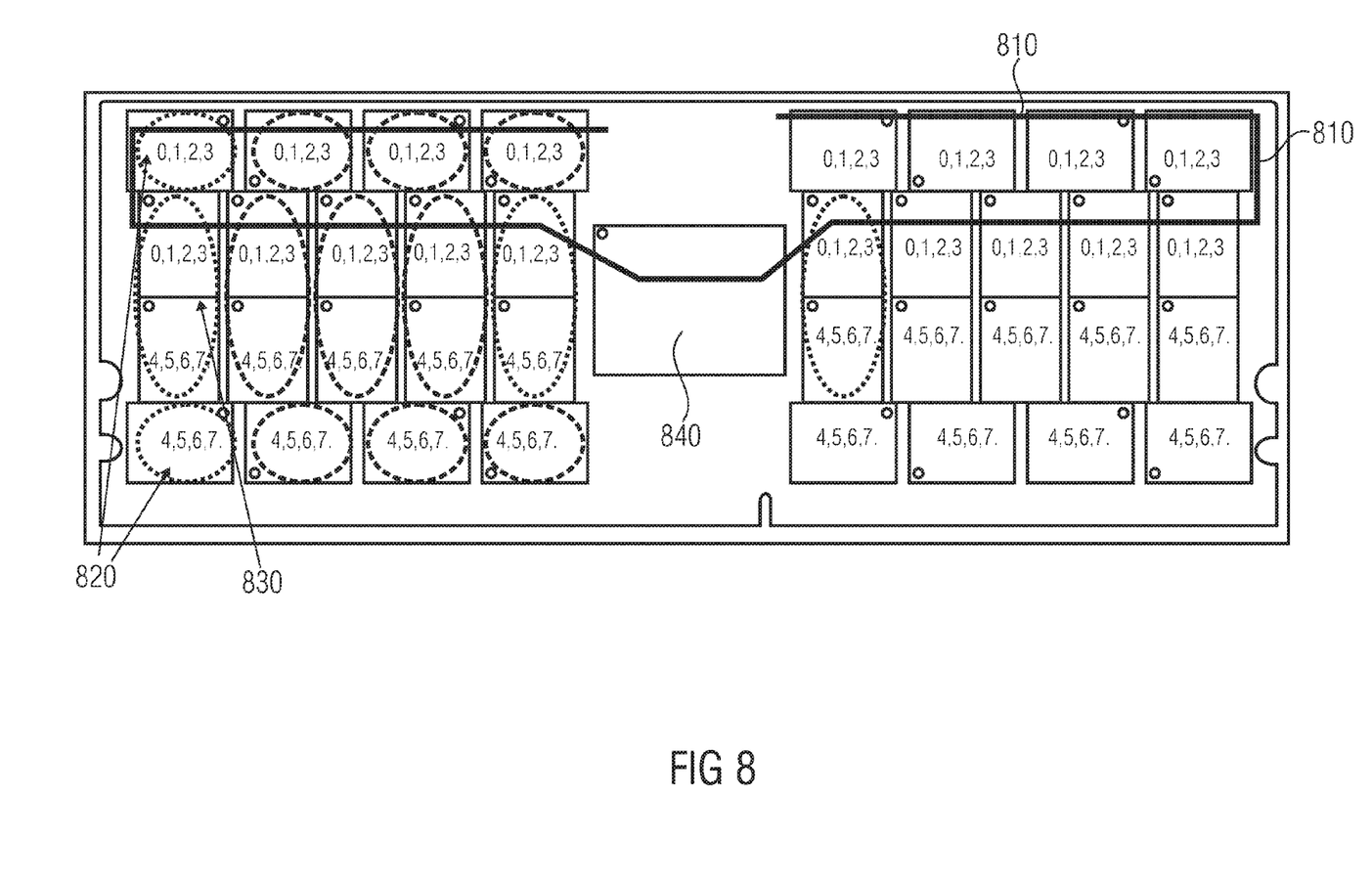
FIG. 8 shows an embodiment of a four-row memory module.

FIG. 8 shows an embodiment of a memory module which can do with one selection line 810 comprising only two branches and thus comprising more favorable power and distortion characteristics. The memory module illustrated in FIG. 8 comprises memory elements which are labeled by the corresponding associated memory ranks and arranged in four rows. By correspondingly re-grouping the DQ groups compared to the arrangement illustrated in FIG. 7, the embodiment can do with one corresponding selection line 810 which only needs to be routed past half of the memory elements. In addition, only two terminations are necessary.

FIG. 8 shows two DQ groups 820 and 830 which in one embodiment each provide four bits or one nibble (1 nibble=4 bits) to the memory buffer 840. As can be seen from the configuration of the embodiment of FIG. 8, different propagation times result compared to FIG. 7. Whereas in FIG. 7 propagation delays of 1 byte have been present, propagation delays of one nibble or 4 bits result in the configuration of FIG. 8. Exemplarily, the nibbles of the DQ groups 820 and 830 form 1 byte, the nibble of the DQ group 830 leading the nibble of the DQ group 820 due to the shorter path to the memory buffer 840. In this configuration, the memory buffer 840 should be able to adjust delays in nibbles.

Figure 9:
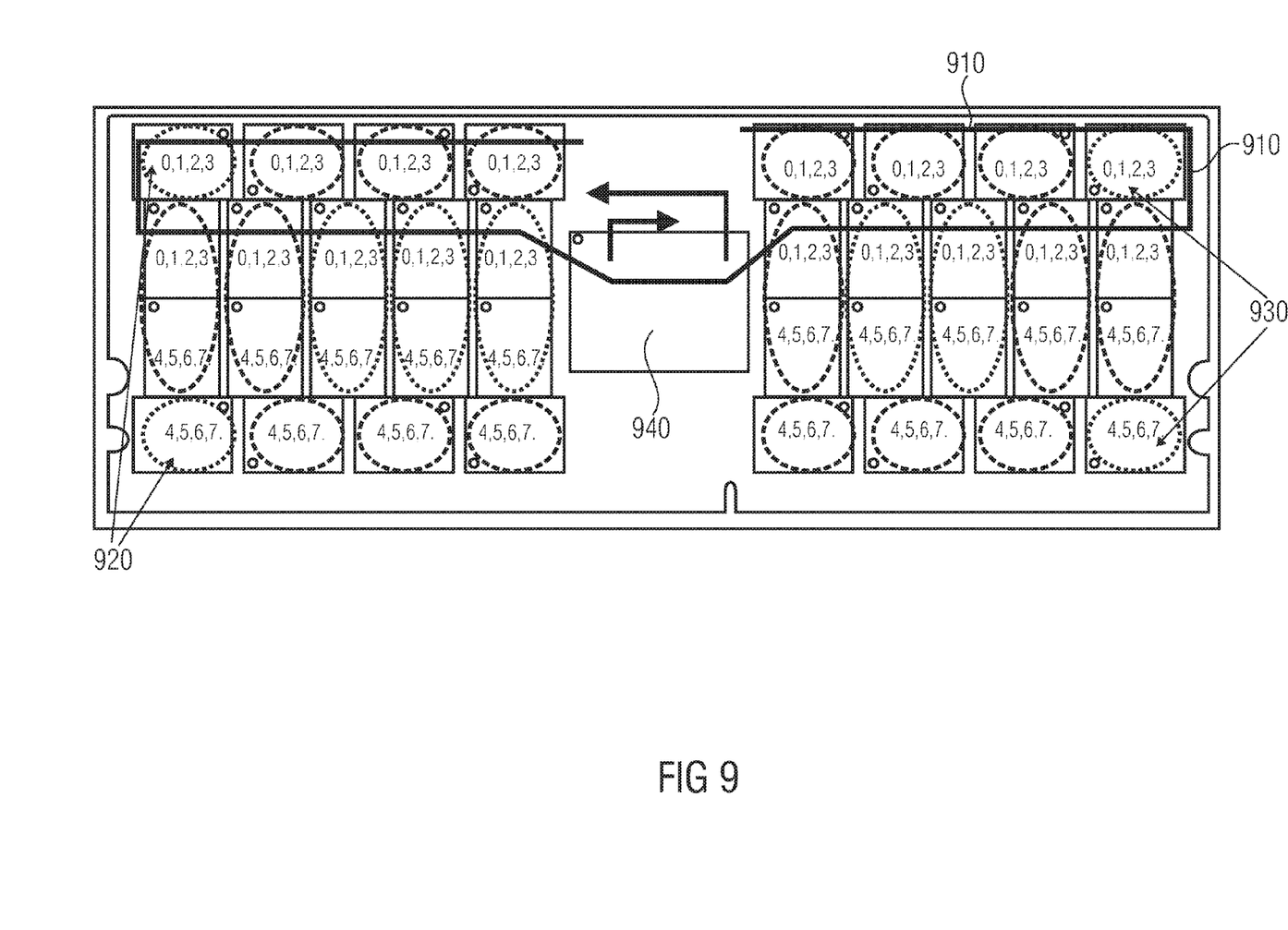
FIG. 9 shows another embodiment of a four-row memory module.

FIG. 9 shows another embodiment of a memory module in which the configuration of the data line has been changed compared to FIG. 8. The same statements already discussed when referring to FIG. 8 also apply for the selection line, so that the memory module in FIG. 9 can do with one selection line 910 which comprises only two branches and is connected only to half of the memory elements. In FIG. 9, two DQ groups 920 and 930 are identified additionally, wherein the data lines here are routed such that they supply 1 byte to the memory buffer 940 at the DQ groups. The arrangement of FIG. 9 allows the memory buffer 940 to adjust a delay in bytes, since the two memory elements belonging to the DQ groups 920 and 930 necessitate identical delays due to equal distances to the memory buffer 940. The memory buffer 940 can thus adjust delays to a respective pair of memory elements in equal distances in bytes. The arrangement shown in FIG. 9 may necessitate data lines to be crossed, which is indicated in the center of FIG. 9 by the two white arrows. Since in the memory buffer 940 one byte of the data bus is made up of one nibble each of the right and left sides of the memory module, it may be necessary in the configuration shown in FIG. 9 to cross the data line. Two nibbles to be combined to form one byte will then have the same distance and thus the same propagation time to the memory buffer 940 so that delays can be adjusted in bytes, however, this necessitates the data lines to be crossed according to FIG. 9.

Figure 10:
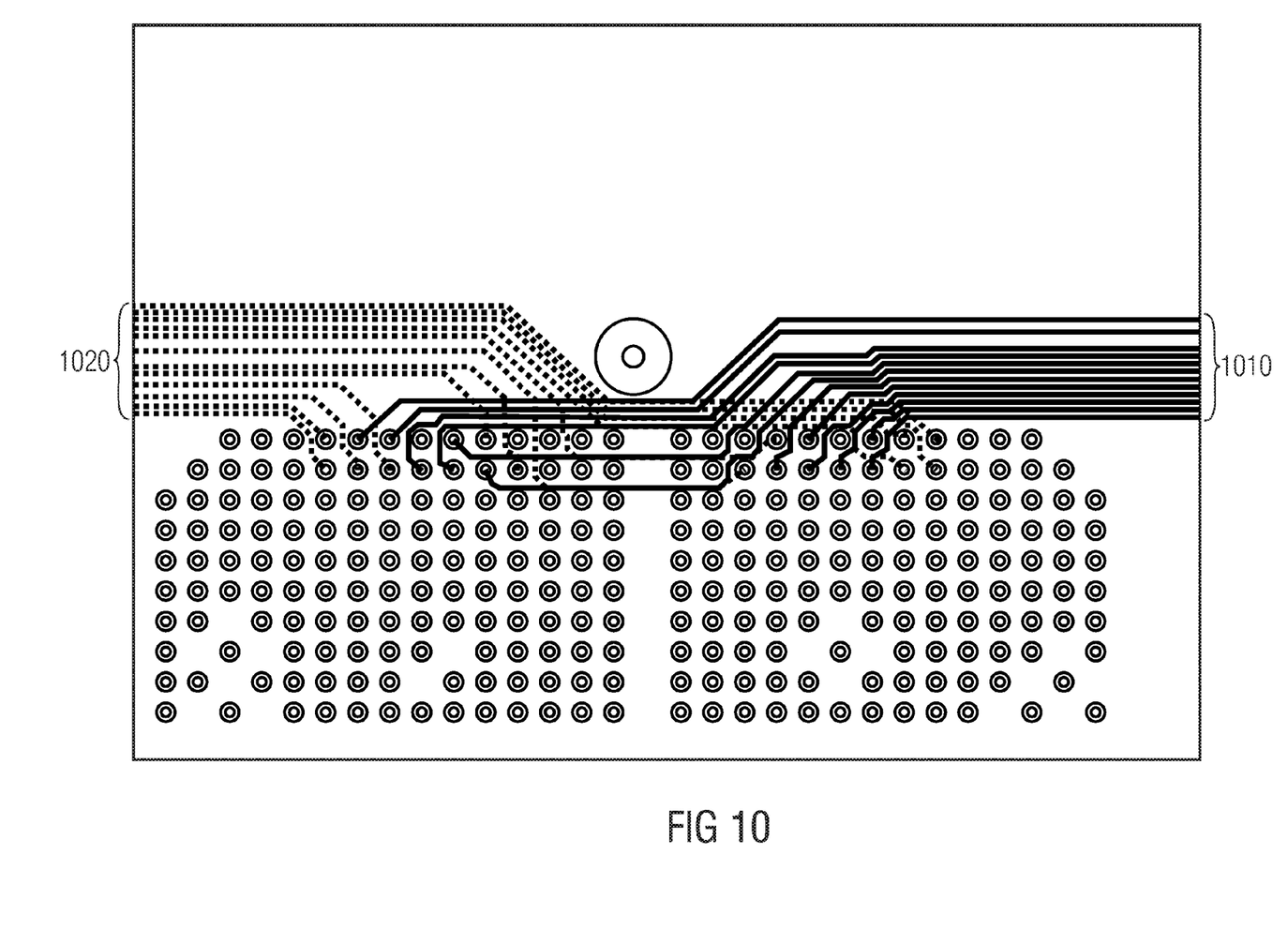
FIG. 10 shows a schematic illustration of the line routing in an embodiment of a memory module.

FIG. 10 shows a schematic illustration of such crossed data lines within the board, FIG. 10 showing that crossing such data lines entails considerable complexity. FIG. 10 shows two line groups 1010 and 1020 of which one each is connected to the left and right sides of the memory module. It can be seen that the line groups cross when 1 nibble each from the right and left sides of the module provide 1 byte of the data bus.

Figure 11:
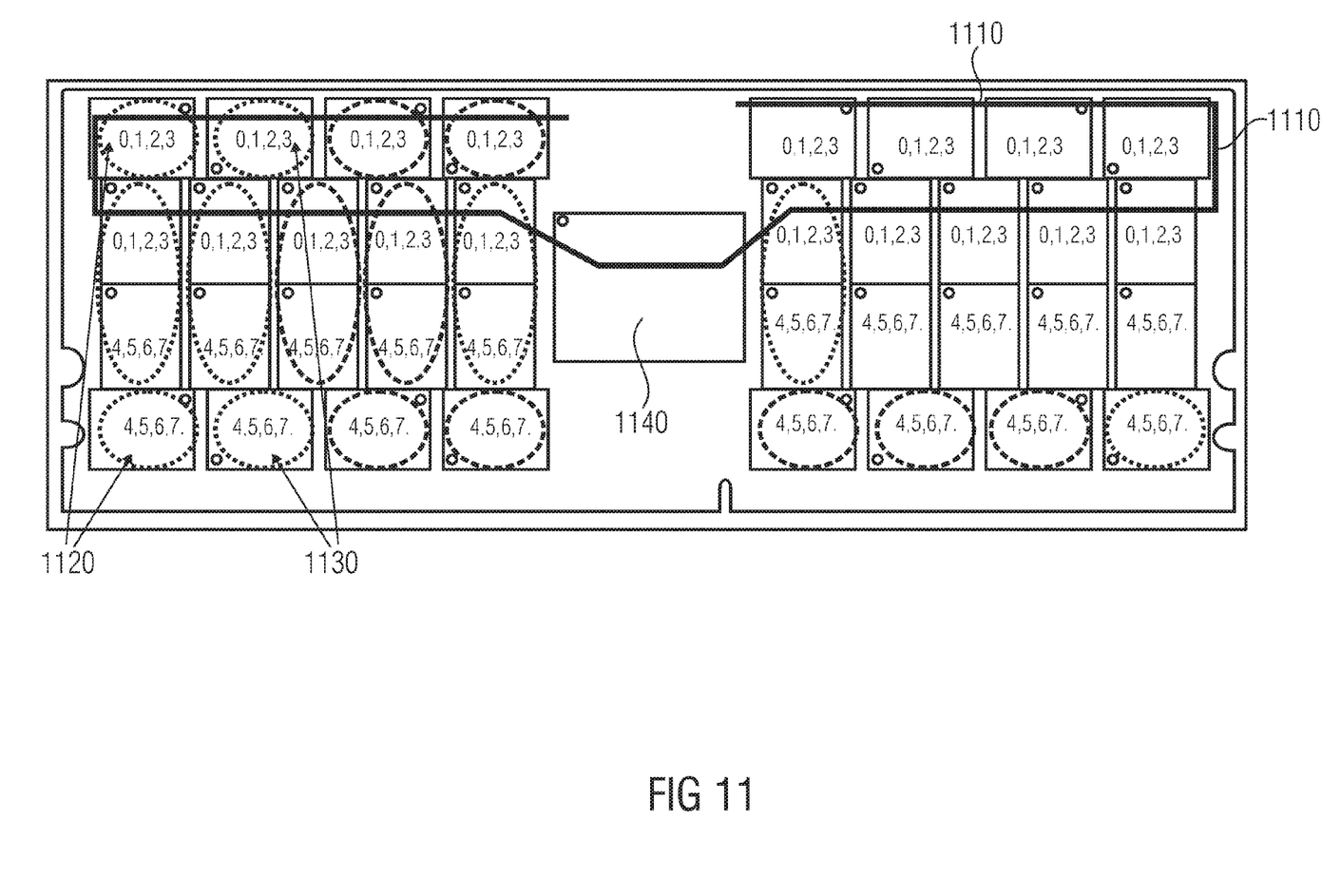
FIG. 11 shows another embodiment of a four-row memory module.

FIG. 11 shows another embodiment of a memory module in which a selection line 1110 is implemented as already described before. Additionally, in FIG. 11 two DG groups 1120 and 1130 each forming 1 byte of the data bus are identified. Due to this configuration, the data lines need no longer be crossed. Due to the propagation time differences within one byte, the memory buffer 1140 can take the respective longer propagation time of the nibble further away into consideration. Since 1 byte is made up of two neighboring memory elements each, in embodiments in the configuration of FIG. 11, delay times of about 200 to 250 ps will occur. The memory buffer 1140 can nevertheless re-adjust delays in bytes considering this time.

Embodiments allow implementing memory modules which due to improved topologies of selection lines can do with less power. In addition, embodiments offer a way of accessing memory elements faster, since signal distortions can be reduced by an improved selection line topology and shorter decay and transit times result.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A memory module comprising:
 a board having a front side and a back side;
 a plurality of memory elements on the board, the memory elements belonging to different memory ranks, each memory rank being addressable via a respective selection signal wherein the memory elements are arranged in rows on the board and the memory elements of a memory rank extend only over half of the rows; and
 a memory buffer comprising a memory rank interface coupled to the memory elements of each memory rank, and a selection signal output for the selection signal of each memory rank.

2. The memory module of claim 1, wherein a memory element comprises a DDR-RAM memory.

3. The memory module of claim 1, wherein the plurality of memory elements are arranged on the front and back sides of the board.

4. The memory module of claim 1, wherein one memory rank includes 18 memory elements.

5. The memory module of claim 1, wherein 4-bit data words are storable in a memory element.

6. The memory module of claim 1, wherein the memory buffer comprises an advanced memory buffer (AMB).

7. The memory module of claim 1, wherein the memory buffer is arranged at a center portion of the front side or back side of the board.

8. The memory module of claim 1, wherein the memory rank interface includes 72 data lines.

9. The memory module of claim 1, comprising four, eight or sixteen memory ranks.

10. The memory module of claim 1, wherein the memory module is arranged as a fully buffered DIMM.

11. A memory module comprising:
 a board;
 a plurality of memory elements on the board, the memory elements belonging to different memory ranks, each memory rank being addressable via a respective selection signal;
 a memory buffer comprising a memory rank interface coupled to the memory elements of each memory rank, and a selection signal output for the selection signal of each memory rank; and a selection line per memory rank coupling the respective selection signal output to the memory elements of the respective memory rank so that the memory elements of the memory rank are addressable via the selection line, the selection line comprising only two branches that are each terminated only at a distal end.

12. The memory module of claim 11, wherein the memory elements are arranged in two rows on at least one side of the board.

13. The memory module of claim 11, wherein the memory elements are arranged in four rows on at least one side of the board.

14. The memory module of claim 11, wherein the memory elements comprise several dies coupled to one another mechanically.

15. The memory module of claim 14, wherein each memory element comprises two or four dies.

16. The memory module of claim 11, wherein a delay is taken into consideration in the memory buffer for each memory element.

17. The memory module of claim 11, wherein a delay is taken into consideration in the memory buffer for two memory elements each or a group of memory elements.

18. The memory module of claim 11, wherein the branches of the selection lines are each terminated by one resistor to a reference potential.

19. A memory module comprising:
a board;
a plurality of memory elements on the board, the memory elements belonging to different memory ranks, each memory rank being addressable via a respective selection signal;
a memory buffer comprising a memory rank interface coupled to the memory elements of each memory rank, and a selection signal output for the selection signal of each memory rank; and
a selection line per memory rank coupling the respective selection signal output to the memory elements of the respective memory rank so that the memory elements of the memory rank are addressable via the selection line, each selection line along the board being routed along only half of the memory elements.

20. The memory module of claim 19, wherein one memory rank includes 18 memory elements.

21. The memory module of claim 19, wherein 4-bit data words are storable in a memory element.

22. The memory module of claim 19, wherein the memory rank interface includes 72 data lines.

23. The memory module of claim 19, wherein a memory element includes a plurality of dies coupled to one another mechanically.

24. A board comprising:
a plurality of first connectivity options for a plurality of memory elements which belong to different memory ranks, each memory rank being addressable via a respective selection signal;
a second connectivity option for a memory buffer comprising a memory rank interface coupled to the first and second connectivity options for the memory elements of each memory rank, and a third connectivity option for a selection signal output for the selection signal of each memory rank, the connectivity options for the memory elements being arranged in rows on the board and the connectivity options of the memory elements of a memory rank extending only over half of the rows.

25. The board of claim 24 comprising:
a selection line per memory rank connecting the respective connectivity option for the selection signal output to the connectivity options of the memory elements of the respective memory rank so that the connectivity options of the memory elements of the memory rank are addressable via the connectivity option of the selection line, the selection line comprising only two branches which may be terminated each at a distal end only.

* * * * *